United States Patent [19]

Wareing et al.

[11] 4,054,044
[45] Oct. 18, 1977

[54] SEALS FOR THE PASSAGE OF WIRE BETWEEN REGIONS OF DIFFERENT PRESSURE

[75] Inventors: Joseph Brian Wareing, Chester; Herbert Hall, Wakefield, both of England

[73] Assignees: The Electricity Council; Johnson & Nephew (Non-Ferrous) Limited, both of England

[21] Appl. No.: 697,807

[22] Filed: June 21, 1976

[30] Foreign Application Priority Data

June 24, 1975 United Kingdom .............. 26799/75

[51] Int. Cl.² .................... B21D 37/16; C23C 13/10; F27D 1/00
[52] U.S. Cl. ................................. 72/38; 29/DIG. 44; 72/46; 72/342; 118/50; 432/242
[58] Field of Search ............... 29/DIG. 21, DIG. 44; 34/242; 72/38, 39, 46, 47, 342; 118/50; 148/156; 266/113; 432/242

[56] References Cited

U.S. PATENT DOCUMENTS

| 496,208 | 4/1893 | Procunier | 148/156 |
| 1,785,037 | 12/1930 | Martell et al. | 427/117 |
| 2,708,843 | 5/1955 | Gibson et al. | 34/242 |
| 2,924,329 | 2/1960 | Compson | 72/342 |
| 3,850,139 | 11/1974 | Franke et al. | 118/50 |
| 3,879,973 | 4/1975 | Godyn et al. | 72/37 |
| 3,952,568 | 4/1976 | Wareing et al. | 72/38 |

FOREIGN PATENT DOCUMENTS 521,259 5/1940 United Kingdom ................ 148/156

Primary Examiner—E. M. Combs
Attorney, Agent, or Firm—Beveridge, De Grandi, Kline & Lunsford

[57] ABSTRACT

A seal for permitting a wire to be fed through a wall separating regions at different pressures, e.g. into and out of a vacuum chamber for heat treatment or coating, comprises a pair of die-shaped elements of hard rigid material each having a bore for passage of the wire, these elements being spaced apart in a tube extending through said wall, means for pumping air from said tube, and an internal wire guide in said tube adjacent one of said holders and having an internal diameter decreasing towards that holder.

11 Claims, 2 Drawing Figures

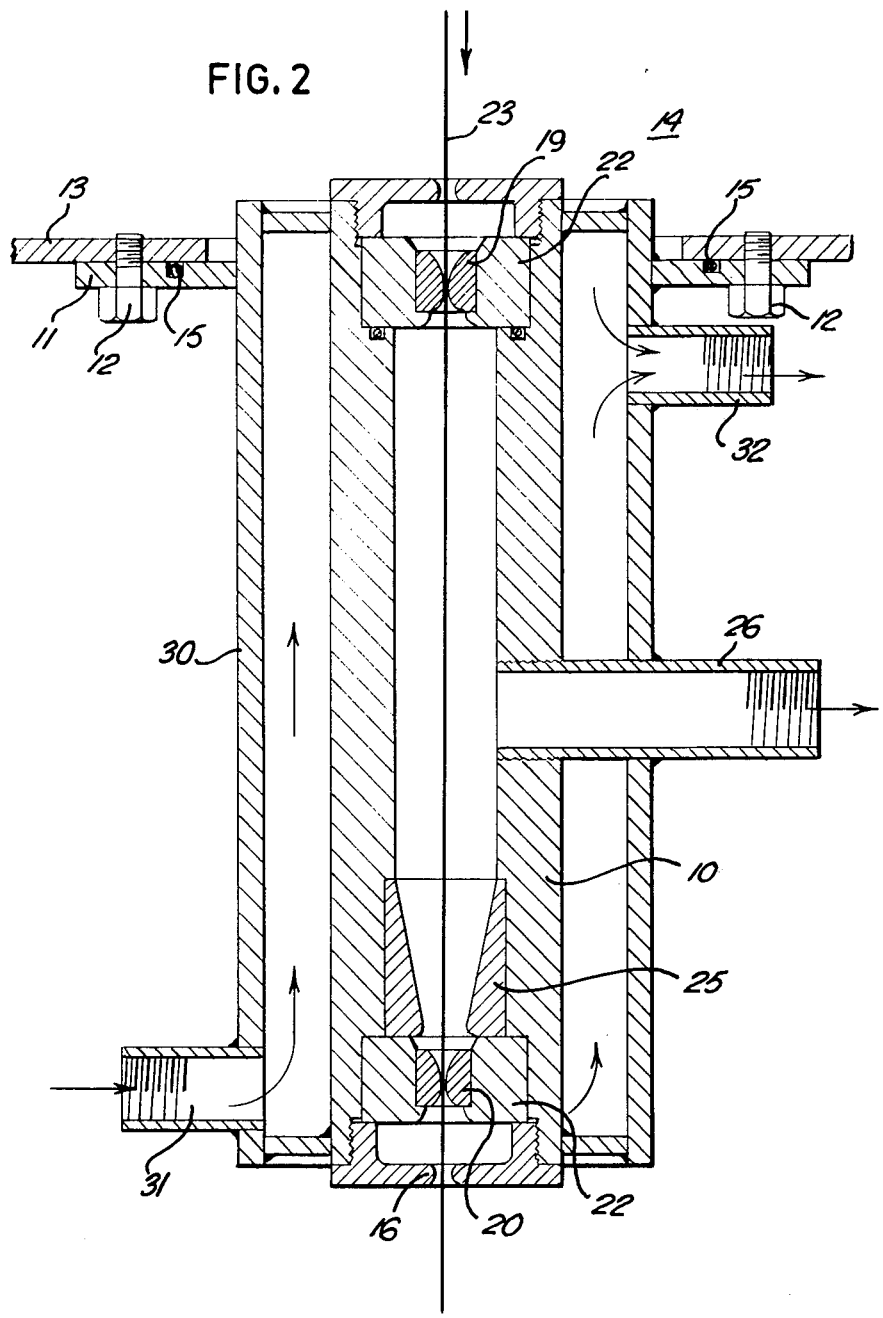

SEALS FOR THE PASSAGE OF WIRE BETWEEN REGIONS OF DIFFERENT PRESSURE

BACKGROUND OF THE INVENTION

1. Field of the Invention

This invention relates to seals for enabling wire to be fed continuously through a wall separating regions of different pressures and to apparatus using such seals.

Such seals are required, for example, in apparatus where the wire is subjected to a treatment, for example heat treatment or coating, which has to be carried out in a vacuum and where the treatment is to be carried out as a continuous operation. The seals enable the wire to be continuously fed through a vacuum closure and hence permit of a continuous process operation.

2. Prior Art

In the U.S. Pat. No. 3,952,568 there is described and claimed a seal permitting the feeding of material of predetermined uniform section through a wall separating regions of different pressures comprising a pair of die-shaped elements located in spaced holders, said die-shaped elements being of hard rigid material and having a bore with clearance for the passage of said rod or wire material, said die-shaped elements furthermore being smoothly curved in any axial section to have a convergent entry portion leading to the narrowest portion and a divergent exit portion, a tube sealed between said holders and a removable insert in said tube externally fitting closely within the tube and having a longitudinal bore for the passage of the rod or wire material.

SUMMARY OF THE INVENTION

The present invention is directed to an improved form of apparatus using die-shaped sealing elements but particularly suitable for use with fine wire. With the aforementioned type of apparatus using a removable insert between die-shaped elements, there is difficulty in threading a fine wire because of the lack of stiffness of the wire.

According to the present invention, a seal for permitting the feeding of wire of predetermined uniform section through a wall separating regions at different pressures comprises a tube extending through and sealed to said wall, a pair of die-shaped elements located one in each of a pair of holders in said tube, said die-shaped elements being of hard rigid material and having a bore with clearance for the passage of the wire, said die-shaped elements furthermore being smoothly curved in any axial section to have a convergent entry portion leading to the narrowest portion and a divergent exit portion, means for pumping air from said tube and an internal wire guide located adjacent one of said holders and having an internal diameter decreasing gradually from the end remote from the holder towards the end nearer said holder.

The die-shaped elements are smoothly curved in longitudinal section otherwise they may be generally similar in construction to wire-drawing dies. They must have a clearance around the wire; this clearance is typically in the range of 0.1 mm to 0.3 mm. Each die-shaped element is preferably parabolic in axial section so as to give a smooth lead-into and lead-out from the region of smallest cross-section. In the construction of the present application, the drag on the wire is considerably reduced compared with the arrangement described in the specification of the aforementioned U.S. Pat. No. 3,952,568.

With the arrangement described above, a fine wire of, say, less than 1.0 mm in diameter can be fed from air into a vacuum chamber using only a single seal as described above. Such a seal can readily be constructed to avoid marking the wire or collecting dirt and debris from the surface of the wire. By continuous pumping, the vacuum can be maintained within the seal whether there is wire passing through the seal or not. The wire guide permits of an adequate diameter of tube between the two die-shaped elements and enables the wire to be threaded through the seal.

Conveniently the tube has end caps for holding the holders in position in the ends of the tube. These end caps may be screw-threaded for securing on the tube or may be provided with a quick-release securing means, for example a bayonet twist fitting.

The seal at the higher pressure end preferably incorporates an elastomeric O-ring between the holder and the tube. For sealing through a wall into a vacuum chamber, the holder at the atmospheric pressure end of the seal may therefore be provided with an O-ring seal so as to restrict leakage of air around the die.

A water cooling jacket may be provided with inlet and outlet pipes for the water cooling of said tube.

The invention furthermore includes within its scope an apparatus for the vacuum processing of wire comprising a vacuum chamber and two aligned sealing systems arranged respectively for entry of the wire into and exit of the wire from the chamber, each sealing system comprising a seal as described above.

BRIEF DESCRIPTION OF THE DRAWINGS

FIGS. 1 and 2 of the accompanying drawings show, in longitudinal section, seals for, respectively, the entry of a wire into and the exit of a wire from a vacuum chamber of electron beam treatment apparatus.

DESCRIPTION OF THE PREFERRED EMBODIMENTS

Figure 1:
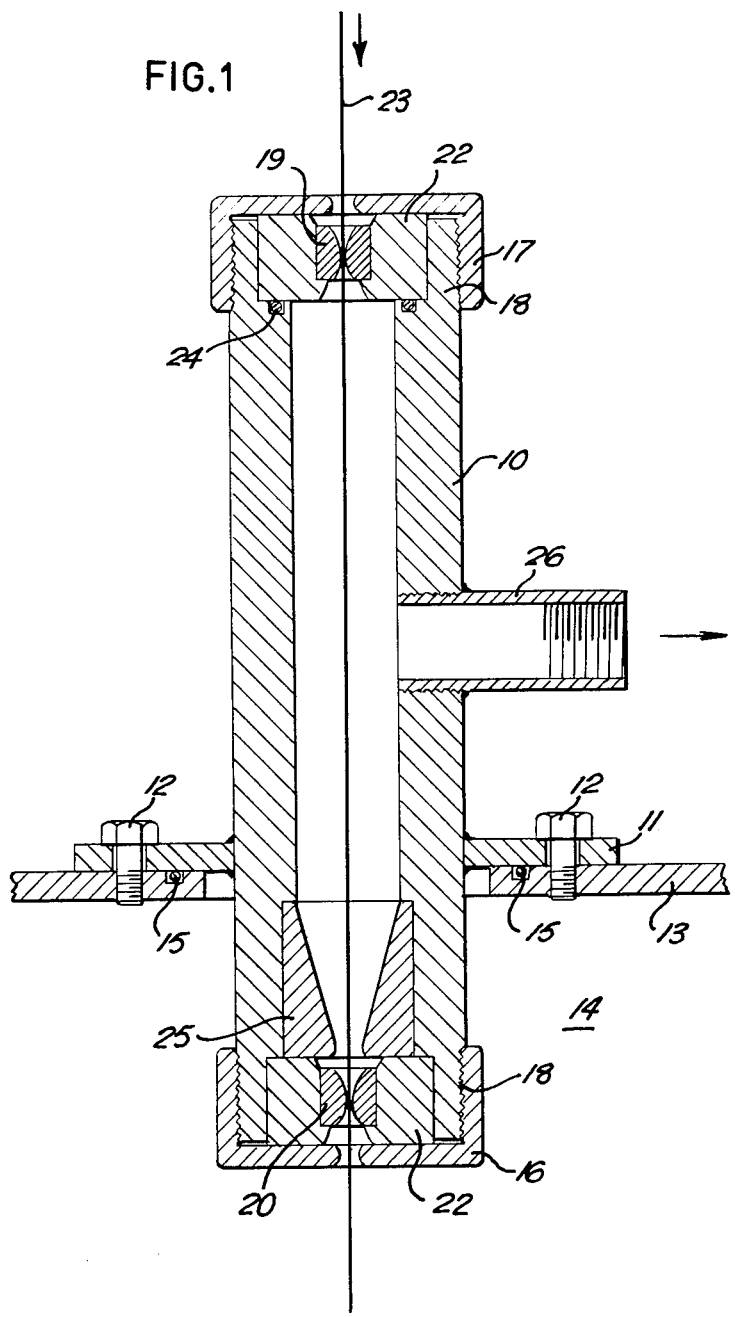

Referring to FIG. 1, there is shown a metal tube 10 which, at a point intermediate between its ends, has a radially extending flange 11 secured by bolts 12 onto the outer face of a wall 13 of a vacuum chamber 14. The flange 11 is welded onto the tube 10 to form an airtight joint between the flange and tube and an O-ring seal 15 is provided in a groove in the wall 13 to seal against a face of the flange 11. The seal unit, in this embodiment, is shown as protruding through the wall 13 of the vacuum chamber 15 but this is not essential; the seal unit however is preferably made so that it can be withdrawn in its entirety from the vacuum system with access only from the atmospheric side.

The tube 10 has end caps 16 and 17 at the vacuum and atmospheric pressure ends respectively. In the drawing, end caps engaging an external thread 18 on the tube 10 are shown but these end caps may alternatively fit into the tube 10, engaging an internal thread on the tube or may be attached to the tube by a suitable quick-release mechanism such as a bayonet fixing for a hard metal or ceramic bush. This bush is generally similar to a tungsten carbide wire-drawing die but is of parabolic form in longitudinal section. The two bushes are shown at 19 and 20 and their holders 22 may take the form of conventional steel or brass cases used as holders for wire-drawing dies.

In a typical construction, for use with wire of diameter up to 0.7 mm, the die-shaped elements may be of 1 mm inside diameter and be of parabolic form in longitudinal section.

In the seal illustrated in FIG. 1, which is for entry into the vacuum chamber, the wire shown at 23 is drawn through the seal in the direction of the arrow A and the die-shaped elements 19, 20 are pulled against locating shoulders in their respective holders 22. The holder at the atmospheric pressure end is provided with an O-ring seal 24 between a shoulder on the tube 10 and the inner face of the holder 22 so as to restrict leakage of air around the die-shaped element.

An internal cone 25 is provided in the tube 10 adjacent to the holder 22 at the outlet end to assist in the threading of the wire through the seal. A branch tube 26 is secured through the wall of the tube 10 and leads to a pump (not shown) for evacuating air from within the tube 10.

The seal of FIG. 2 is generally similar to that of FIG. 1 and the same reference numerals are used to indicate corresponding features. In FIG. 2 the retaining caps 16 and 17 for the die-shaped elements are screwed into the tube 10. The seal of FIG. 2 is provided with water cooling to enable it to be used with hot wire and it is illustrated as being the outlet seal from a continuous in-line vacuum furnace. The furnace wall is shown at 13 and the wire enters the seal from the furnace in the direction of the arrow B. In some cases it might be sufficient to cool the die-shaped elements by water cooling through channels in the external surface of the die-shaped elements. However in the construction shown in FIG. 2, there is a full length water jacket 30 around the tube 10. Water is introduced into this jacket via an inlet pipe 31 at one end of the jacket and leaves through an outlet tube 32 near the other end of the jacket.

It will be noted that each of the seals is formed as a single unit with only two die-shaped elements. In a typical consturction the overall length of the seal may be no more than 60 mm.

We claim:

1. A seal for permitting the feeding of wire of predetermined uniform section through a wall separating regions at different pressures comprising a tube extending through and sealed to said wall, a pair of die-shaped elements positioned in a pair of holders located one in each end of said tube, said die-shaped elements being of hard rigid material and having a bore with clearance for the passage of the wire, said die-shaped elements furthermore being smoothly curved in any axial section to have a convergent entry portion leading to the narrowest portion and a divergent exit portion, means for pumping air from said tube and an internal wire guide located adjacent one of said holders and having an internal diameter decreasing gradually from the end remote from the holder towards the end nearer said holder.

2. A seal as claimed in claim 1 wherein the die-shaped elements have a clearance in the range of 0.1 mm to 0.3 mm around the wire to be fed through the seal.

3. A seal as claimed in claim 1 wherein each element is parabolic in axial section so as to give a smooth lead-into and lead-out from the region of smallest cross-section.

4. A seal as claimed in claim 1 wherein the tube has end caps for holding said holders in position in the ends of the tube.

5. A seal as claimed in claim 4 wherein the end caps are screw-threaded for securing each end cap on the tube.

6. A seal as claimed in claim 4 wherein the end caps are provided with a quick-release securing means for securing each end cap on the tube.

7. A seal as claimed in claim 1 wherein the holder at the higher pressure end of the seal is sealed to said tube with an elastomeric O-ring seal between the tube and the holder.

8. A seal as claimed in claim 1 and having a water cooling jacket with inlet and outlet pipes arranged for the water cooling of said tube.

9. An apparatus for the vacuum processing of wire comprising a vacuum chamber and two aligned sealing systems arranged respectively for entry of the wire into and exit of the wire from the chamber, each sealing system comprising a tube extending through and sealed to said chamber, a pair of die-shaped elements positioned in a pair of holders located one in each and of said tube, said die-shaped elements being of hard rigid material and having a bore with clearance for the passage of the wire, said die-shaped elements furthermore being smoothly curved in any axial section to have a convergent entry portion leading to the narrowest portion and a divergent exit portion, means for pumping air from said tube and an internal wire guide located adjacent one of said holders and having an internal diameter decreasing gradually from the end remote from the holder towards the end nearer said holder.

10. A seal for the feeding of wire of predetermined section through a wall into a vacuum chamber comprising a tube extending through and sealed into said wall, a pair of die-shaped elements, a pair of holders for the respective elements, said holders being located one in each end of the tube, said die-shaped elements being of hard rigid material, each element having a bore and being parabolic in axial section so as to give a smooth lead-into and lead-out from the region of minimum cross-section of the bore, said region of minimum cross-section having a clearance in the range of 0.1 mm 0.3 mm around the wire, means for pumping air from said tube, and an internal wire guide located in said tube adjacent the element at the chamber end of the tube, said wire guide having an internal diameter decreasing gradually from the end remote from the adjacent element towards the end nearer that element.

11. In apparatus having a vacuum chamber for heat treatment of wire of predetermined section, with means for feeding the wire continuously through the chamber and having a seal in a wall of the chamber for the wire to pass out of the chamber, the improvement comprising the provision, as said seal, of a seal-holder extending through and sealed to said wall, said seal holder including a tube and means for water-cooling said tube, a pair of die-shaped elements, a pair of holders for the respective elements, said holders being located one in each end of the tube, said die-shaped elements being of hard rigid material, each element having a bore and being parabolic in axial section so as to give a smooth lead-in and lead-out from the region of minimum cross-section of the bore, said region of minimum cross-section having a clearance in the range of 0.1 mm to 0.3 mm around the wire, means for pumping air from said tube, and an internal wire guide located in said tube adjacent the element further from the chamber, said wire guide having an internal diameter decreasing gradually from the end remote from the adjacent element towards the end nearer that element.

* * * * *